United States Patent [19]

Grodinsky

[11] Patent Number: 4,500,850
[45] Date of Patent: Feb. 19, 1985

[54] AUDIO AMPLIFIER APPARATUS WITH MINIMUM NON-LINEAR DISTORTION

[76] Inventor: Robert Grodinsky, 4448 W. Howard St., Skokie, Ill. 60076

[21] Appl. No.: 313,658

[22] Filed: Oct. 22, 1981

[51] Int. Cl.³ .............................................. H03F 3/04
[52] U.S. Cl. ....................................... 330/307; 330/66
[58] Field of Search ................. 330/307, 294, 310, 66; 361/404, 405

[56] References Cited

U.S. PATENT DOCUMENTS 4,403,200 9/1983 Davis ................................. 330/294

Primary Examiner—James B. Mullins
Assistant Examiner—G. Wan
Attorney, Agent, or Firm—Russell E. Hattis

[57] ABSTRACT

The previously unknown cause of significant non-linear distortion by non-linear discrete and stray capacitances located in portions of an amplifier circuit where Miller effect enhancement of such capacitance occurs is minimized by one or more means, such as utilizing unique discrete capacitor arrangements and positioning of transistor terminal leads, and unique printed circuit board constructions and selectively applied solder mask coatings which minimize or eliminate non-linear stray capacitance effects which were not heretofore considered to be a problem in audio amplifier circuits. Non-linearities in capacitance-voltage characteristics are reduced by the reduction in voltage gradients achieved by connecting two or more capacitors in series to produce the overall desired capacitor value heretofore supplied by only a single capacitor. Distortion producing Miller effect enhanced stray capacity effects between control and load terminals of amplifying transistors or across the discrete capacitors in the multistage negative feeding circuits of audio amplifiers are reduced by modifying the dielectric properties constant of the printed circuit board as by placing apertures therein between the conductive strips to which such transistor terminals and capacitors are connected, or by increasing the distance between points of connections of these terminals to the printed circuit board, generally requiring the extension of one or more of the leads involved parallel to the circuit board.

9 Claims, 6 Drawing Figures

AUDIO AMPLIFIER APPARATUS WITH MINIMUM NON-LINEAR DISTORTION

BACKGROUND OF THE INVENTION

The quality of reproduced sound seldom satisfies those critics who have the ability to remember what real musical performances sound like. Over the years, the specifications of equipment in regard to frequency response and distortion have improved; yet there remain reputable critics who dislike the sound of the improved designs and point to the "musically correct" qualities of lessor specification designs, usually older vacuum tube equipment. This diversity of opinion has led to some investigations into design factors which improve the measured distortion but do not improve the quality of sound reproduction. The most common method for both reducing distortion and improving frequency response is to use some form of negative feedback.

For some time, most improvements in amplifier designs tended to involve the use of increasing amounts of negative feedback. Because of stability limitations, vacuum tube amplifiers seldom featured more than 20 db of feedback. With the advent of wideband transistors, designs using up to 60 db of feedback were perfected.

Otala showed that the stabilizing procedures used in designing amplifiers with large amounts of feedback led to increases in distortion for transient or fast slope signals and that this type of distortion which he called "Transient Intermodulation Distortion" or TIM was caused by loop negative feedback and did not occur if loop feedback was not used. As a result of this analysis, using less loop negative feedback became the rule, in some cases it was eliminated entirely. Alternative ways of improving frequency response and distortion without negative feedback have proven very expensive. When small amounts of negative loop feedback are used in a properly stabilized design, the amount of TIM should be minimal. Yet distortion can still be clearly heard. I have discovered that these residual distortions are not caused by the TIM fast slope mechanism but by non linear phenomina in supposedly passive circuit components. The elimination of these component produced distortions allows for designs using moderate amounts of loop feedback for optimum reduction of all types of distortion.

It is the object of the present invention to reduce the distortion of non linear passive circuit elements in amplifier circuits. A further object is to increase the quality of audio amplifiers at minimum cost, further objects will be evident by reading the specifications and drawings.

SUMMARY OF THE INVENTION

I have discovered that passive circuit elements of audio amplifier circuits, primarily discrete capacitors or stray capacitance located portions of the circuit where Miller-effect amplifications of capacitance occurs, frequently materially contribute to audible distortions in audio amplifier systems. Thus, in an amplifier circuit involving substantial gain, the presence of any non-linearities in the amplitude or frequency response characteristics of the capacitors or stray capacitance between the base collector or emitter terminals of a transistor in an amplifying circuit or in the discrete capacitors or stray capacitance in the multi-stage negative feedback circuit of an audio amplifier can contribute significant distortion in the output of the amplifier circuit. Similar distortion can be introduced, but usually to a lesser degree, by non-linear discrete resistors or leakage resistance in these critical portions of the audio amplifier circuit. The various features of the present invention minimize these distortions primarily by improving the linearity of discrete or stray capacitance or by decreasing the amount of stray capacitance in the feedback portions of an audio amplifier circuit where the Miller effect (i.e. amplification of capacitance) is present.

In accordance with one of the features of the invention, instead of utilizing a single capacitor of a given desired value between two points of a negative feedback circuit where the Miller effect is present, a pair of high quality capacitors are connected in series across such points of a value which produces a resulting capacitance of the overall desired value. (Such a capacitor arrangement which requires two larger and more expensive capacitors than a single capacitor of similar quality would be unobvious since prior audio amplifier designs did not appreciate the need or advantage of such a capacitor duplication.) In such case, the voltage gradient across each capacitor is substantially reduced. The non-linearity of capacitors is often partly a function of the voltage gradient applied thereacross and so the connection of two capacitors in series will generally reduce the non-linearity effects of the capacitor-containing portion of the circuit involved.

I have discovered that in many audio amplifier circuit designs the contribution of stray capacitance enhanced by the Miller effect to distortions produced in the circuit is sufficiently material that the reduction of this stray capacitance can materially improve the quality of the sound produced by the audio amplifier system involved. In this connection, it has been discovered that the typical synthetic plastic materials used to make circuit boards has a dielectric property which produces non-linearities in the stray capacitances defined by and between spaced confronting portions of the conductive strips thereof which can be significant in Miller effect-producing portions of the circuit. Thus, in accordance with this aspect of the invention, a region of the circuit board between terminals where Miller effect enhanced stray capacitance is present is reduced by cutting a hole in the portion of the circuit board between the confronting portions of the circuit board referred to, so as to reduce the dielectric constant thereof and hence the stray capacitance value between these points. Of course, the presence of a stray capacitance which has no significant non-linearity would not create any distortions in the circuit and so, in accordance with a broader aspect of the invention, the aperture referred to produced in the circuit board which would create non-linear effects of significance could be filled with a dielectric material which introduces no non-linearities in the stray capacitance involved. This, however, would involve an additional expense which is not necessary in accordance with the preferred form of the invention, which leaves the aperture with an air dielectric between the stray capacitance-forming points involved.

In making printed circuit boards which have conductive strips on one or both sides thereof, it has been customary to insulate these conductive strips by an insulating coating (sometimes called a solder mask coating) which is applied over the entire exposed surface of each side of the circuit board including the conductive strips, except for those points thereof where a solder junction is to be made. I have discovered that the insulating coatings used heretofore in many cases produce a more non-linear stray capacitance between the stray capacitance-forming points of the circuit board. In accordance with a further feature of the invention, the conductive strips in the vicinity of the areas of the printed circuit board where the Miller effect-enhanced capacitances are present are left uncoated with the solder mask material, so that the solder mask material will not introduce non-linearities in the stray capacitances present between these critical points of the circuit.

In accordance with a further feature of the invention, to further minimize the effect of any non-linear stray capacitances which may be present in the circuit in those areas where Miller effect capacitance enhancement is present, the spacing between the points of connection of the terminal leads of amplifying devices like transistors, across which the Miller effect is produced, is maximized. Thus, while it is conventional to connect transistors or the like to points on the conductive strips by soldering or welding vertically extending leads thereof to closely spaced points of the conductive strips involved so that the transistor and its leads occupy minimum area of the circuit board, one or more of the terminal leads of an amplifying transistor are left relatively long and are extended parallel to the circuit board so that the base and collector terminal leads involved connect to substantially rather than closely spaced conductive strips of the circuit board. Such a large spacing of the transistor leads and the associated conductive strips was not before utilized because Audio amplifier circuit designers did not appreciate that non-linearities were present in stray capacitances materially magnified by the Miller effect which add significant distortion to the audio signals amplified by the circuit involved.

The above and other advantages and features of the invention will become apparent upon making reference to the specification to follow and the drawings and claims.

DETAILED DESCRIPTION OF THE INVENTION AND EXEMPLARY FORM THEREOF

Negative feedback reduces distortion in amplifier circuits by comparing the input signal with a fraction of the output signal. The expression "negative" feedback and the basic theory assumes that the signals which are combined are 180° out of phase from each other and thus a subtraction or difference signal can be obtained. The final distortion Dfb will then be $$Dfb = Do(1 - Aob)$$

where Do is the open loop distortion, Ao is the open loop gain and B is the feedback fraction. If, however, the feed back signal to be compared with the input signal is not close to 180° out of phase with the input, then the distortion reduction will be less than as expected in the formula and as the phase difference approaches 90° will add rather than reduce distortion. A feedback path which is coupled through a capacitor is a signal in which the current leads the voltage by 90°. The magnitude and the phase of the feedback signal are a function of the value of the capacitor and the frequency of the signal. Thus where the feedback through the capacitor becomes effective the phase angle of the feedback signal is no longer 180° in opposition to the input signal. Unfortunately many types of capacitors are capable of changing value as a result of applied voltage or current fluctuations. When this happens both amplitude and phase modulation distortion are produced. In present day transistor amplifier design this distortion is most prevelent in those circuits where the "Miller effect" multiplies the effective value of the capacitors.

Figure 1:
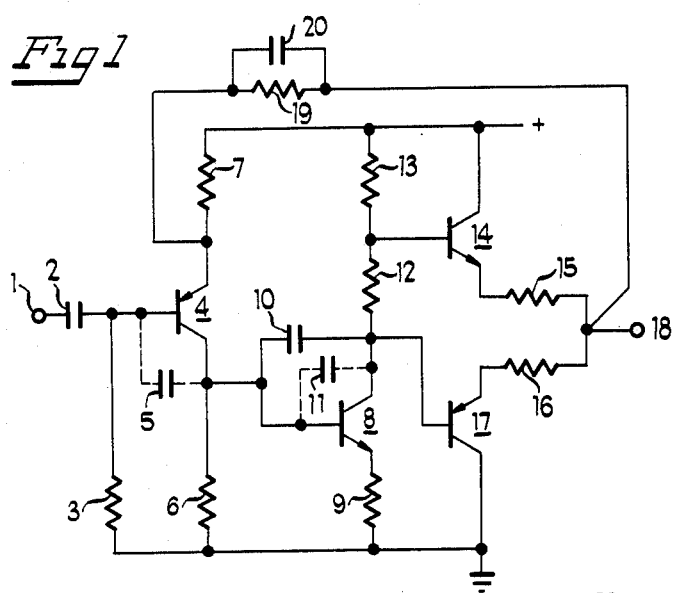
FIG. 1 is a circuit diagram of a two stage negative feedback amplifier which incorporates the invention.

FIG. 1 is an exemplary circuit of a 2 stage transistor amplifier which is basic to either a voltage gain stage or a power amplifier. Reference numeral 1 is the input to which a source of AC signals is applied which is coupled thru series capacitor 2 to the base of a PNP transistor 4. A resistor 3 coupled between ground and the base of transistor 4 supplies the forward bias current path for the transistor 4. A resistor 7 connected between the emitter of transistor 4 and a B+ bus provides local degeneration. The output signal is developed across a load resistor 6 connected between the collector of transistor 4 and ground. This signal is direct coupled to the base of an NPN transistor 8, which has connected between the collector of transistor 8 and the B+ bus series connected resistors 12 and 13. Resistor 12 is used to bias series connected emitter follower output transistors, comprising an NPN transistor 14 and a PNP transistor 17. The collector of transistor 14 is connected to the B+ bus and the collector of transistor 17 is connected to ground. Local stabilizing degeneration is obtained by using resistors 9, 15 and 16 respectively connected in series with the emitters of transistors 8, 14 and 17. The main output signal appears at terminal 18 connected to the juncture of resistors 15 and 16 and loop negative feedback is coupled back to the emitter of transistor 4 through resistor 19 in parallel with capacitor 20. There are two stray capacitance feedback paths associated with each given stage, one thru the internal capacity of each transistor and the other thru the stray capacitance between the spaced conductive strips on a printed circuit board on which the circuit is formed. Reference numerals 5 and 11 are the stray capacitances of transistors 4 and 8. It is usual design practice to establish a single pole rolloff to insure feedback stability by inserting a capacitor 10 between the collector and base of transistor 8 in parallel with the stray capacitance 11.

I have discovered that a substantial proportion of stray capacitances 5 and 11 is commonly due to the printed circuit board formed stray capacitance and that such stray capacitances introduce appreciable non-linear distortions into the amplified signals at points in the circuit where these stray capacitances are enhanced by the Miller effect. Also, extensive listening experience has surprisingly revealed that unexpected non-linearities in the capacitor 10 were the source of appreciable audible distortions. A typical value for this capacitor is 50–150 picofarads. When a ceramic disk is used for capacitor 10 much greater distortion is noted than if more linear types such as mica or glass based are used. Even with a quality capacitor such as mica, a further reduction in distortion was noted when two capacitors 20 were connected in series so as to lower the voltage across each of the capacitors. This was more evident in power amplifiers where the voltage swings can reach 40–80 volts peak. The same conditions apply to capacitor 20 which sees the full amplifier voltage swing and also must be a quality linear capacitor. Accordingly, in the actual circuit board embodiment of my invention shown in FIG. 2, the single high quality mica capacitor shown in FIG. 1 is replaced by a pair of mica capacitors 10A and 10B of twice the size of capacitor 10 which significantly reduce non-linearities in the capacitor versus voltage characteristic thereof, since each capacitor now has only half of the voltage thereacross than does capacitor 10. Manifestly, it is unlikely that it has heretofore been considered to replace an expensive mica capacitor 10 by two similar twice as expensive capacitors having the same overall capacitance as capacitor 10 without having knowledge of my discovery that such a capacitance could significantly introduce non-linear distortions in the amplified signals involved.

With regard to the non-linear distortions I discovered were introduced by printed circuit boardformed stray capacitance, a noticeable reduction in non-linear distortions were obtained by modifying the dielectric properties of the dielectric material between those portions of the printed circuit board to which the leads of the amplifying transistors are connected.

Figure 2:
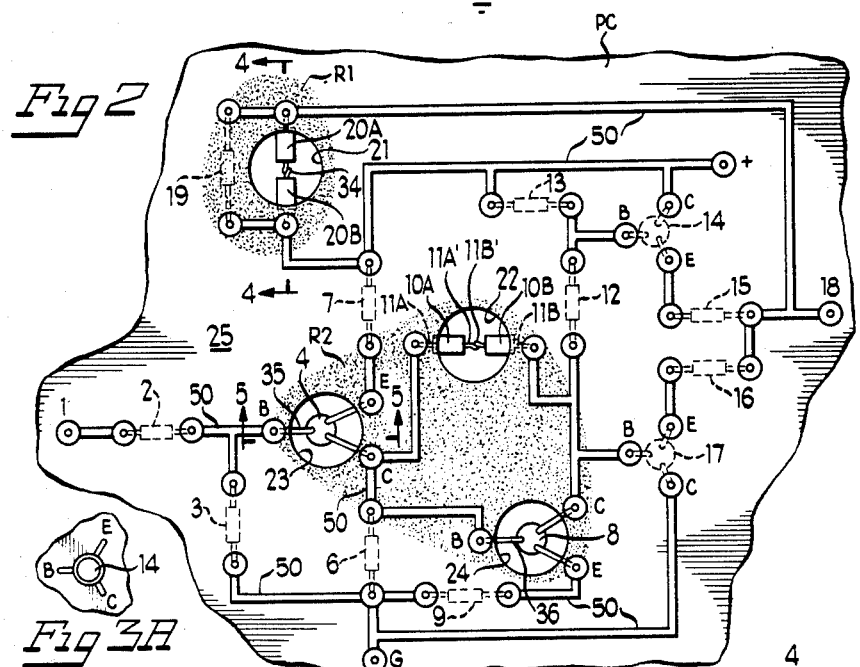
FIG. 2 is a printed circuit board layout for the exemplary circuit of FIG. 1 viewed from the side thereof containing conductive strips to which various circuit elements are connected from the opposite side of the circuit board.

A reference should now be made to FIG. 2 which shows the layout of the various components shown in FIG. 1 on a printed circuit board PC and where capacitors 10 and 20 shown in FIG. 1 have been replaced by series capacitors 10A-10B and 20A-20B each of twice the value of the capacitors 10 and 20, so that the resultant capacitance values of the series connected capacitors are identical to the capacitors 10 and 20. Corresponding reference numerals are shown in FIG. 2 opposite those circuit elements corresponding to those of FIG. 1. FIG. 2 is a fragmentary view of the side of the printed circuit board PC containing various conductive strips 50 made of copper or the like to which conductive strips the leads from the various circuit elements shown in FIG. 1 are connected, as by soldering the terminal leads thereof in the manner shown in FIGS. 4 and 5. While the circuit board could have conductive strips 50 on both sides thereof, in the particular embodiment of the invention shown in FIG. 2, these strips are on only one side of the circuit board. The various capacitors, resistor and transistor elements are on the opposite side of the circuit board from that shown in FIG. 2, and the leads thereof pass through apertures in the printed circuit board and the conductive strips, the apertures being subsequently filled with solder 5 which interconnects the lead ends to the conductive strips.

Figures 4, 5:
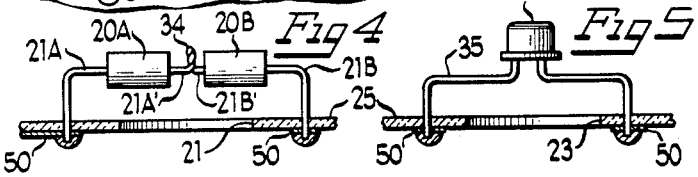
FIG. 4 is an enlarged sectional view of the circuit board shown in FIG. 2 such as taken along section line 4—4 therein, and which shows a pair of series connected capacitors extending between a pair of terminals exhibiting the Miller effect in the amplifier circuit of FIG. 1.
FIG. 5 is an enlarged sectional view of a unique transistor lead placement shown in FIG. 3b, as seen along section line 5—5 in FIG. 3b.

To reduce the non-linear stray capacitance effects across the critical Miller effect-enhanced stray capacitances introduced by the printed circuit board, the printed circuit board material is preferably removed between the confronting ends of the various conductive strips at these points in the circuit so that a much lower, air dielectric constant material is located between the confronting ends of these condutive strips, which eliminates any non-linear distortions in the resulting stray capacitance unexpectedly introduced by the printed circuit materials as well as reduces the value of these stray capacitance. Accordingly, FIG. 2 shows apertures 21, 22, 23 and 24 respectively between those portions of the conductive strips 50 to which the circuit board connecting leads of the capacitors 20A–20B and 10A–10B, base and collector terminals of amplifying transistor 4, and base and collector terminals of the amplifying transistor 8 are connected. Accordingly, as best shown in FIG. 4, the capacitors 20A–20B and 10A–10B are placed in spaced relationship along a line generally parallel to the surface of the circuit board with the outer most leads 21A-21B and 11A-11B extending into the circuit board and the contiguous leads 21A'-21B' and 11A'-11B' at adjacent ends of these capacitors soldered together and raised to a near maximum degree above the circuit board. The associated circuit board openings 21 and 22 preferably extend to the extremities of these capacitor pairs to maximize the amount of printed circuit board material removed from the vicinity of the confronting ends of the conductive strips 50 into which the outermost leads extend, to reduce the stray capacitance introduced by the circuit board. While, theoretically, the apertures 21, 22, 23 and 24 do not need to be permanent holes in the circuit board since they could be replaced by a perfectly linear dielectric material, there is no point in increasing the expense of the circuit board by so doing.

Figures 3A, 3B:
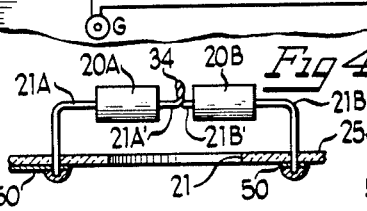
FIG. 3A is a fragmentary view of a portion of the circuit board of FIG. 2 as viewed from the opposite side thereof showing the terminal lead placement of a transistor in a portion of the amplifier circuit which does not exhibit any significant amplification.
FIG. 3B is a fragmentary view from the opposite side of the circuit board shown in FIG. 2 and shows the unique terminal placement of a transistor forming an amplifier where substantial amplification takes place, where the Miller effect creates problems overcome by the present invention, the figure also showing the transistor positioned above an aperture in the printed circuit board which reduces stray capacitance between the critical terminals of the transistor.

In addition to providing apertures 23 and 24 between the base and collector terminal connecting points of the amplifying transistors 4 and 8, (such apertures also extending between the confronting surfaces of the conductive strips 50 involved) the size of these apertures and the spacing between the confronting ends of these conductive strips is maximized by a unique orientation of the terminal leads extending from the transistors 4 and 8. It should be observed that it has heretofore been desirable to maximize the compactness of the circuit element arrangement on the circuit board by making the points of connection of the base, collector and emitter leads of the transistors to the circuit board at relatively closely spaced points falling along a relatively small triangle shown in FIG. 3A, so that the connecting points are approximately equally spaced apart. In such case, the leads extending from the transistor extend generally vertically into the circuit board. The lead connections of the non-amplifying transistors 14 and 17 have such a lead placement. However, in the case of the amplifying transistors 4 and 8, which cause Miller effect-enhancement of stray capacitance, at least the base leads 35 and 36 of the transistors 4 and 8 extend from the transistor housing in a generally horizontal direction away from the collector and emitter leads. It is preferred also that the collector and emitter leads extend from the transistor housing involved in a direction parallel to the printed circuit board where they extend into the circuit board at the opposite side of the associated printed circuit board apertures 23 or 24. However, for maximum compactness, since the spacing between the emitter and collector lead connections do not affect the distortion-producing stray capacitance, the spacing of the terminal ends of these leads and the conductive strips involved are relatively small in comparison to the spacing between the base and collector lead connections and the associated conductive strips. Thus, as shown in FIG. 3B, these points of connection are located at the corners of a triangle having two relatively long sides between the base and the emitter and collector lead connection points and a relatively short side between the emitter and collector lead connection points. Also shown in the cross section of FIG. 5 is the side view of transistor 5. The base lead 35 is shown bent to the left so as to span a larger distance than is ordinarily done, approximately 0.6 inches instead of the usual prior art 0.2 to 0.3 inches. The collector and emitter leads are similarly bent to span a similar distance over the opening 23. The added spacing reduces the effect of the coupling between base and collector.

By using these techniques for minimizing both the amount of stray capacity and the non-linear distortions of the various circuit capacitors, the overall distortion of amplifier circuits is noticably improved. Little additional expense in invoked in drilling the extra holes in circuit boards and in series connecting the needed capacitors.

It is normal procedure when manufacturing printed circuit boards to apply a solder mask to the copper side of the board to prevent soldering of the areas of the copper where there are no part leads to be connected. This is done to both reduce the amount of solder used and to minimize "solder bridging" which can create short circuits between the lead connections. Unfortunately the chemicals used for this solder mask and other protective coating are usually an additional non-linear dielectric and or resistance element which adds distortion. By eliminating the solder mask in the vicinity of the input to output connections of gain stages or feedback connecting elements these distortions can be prevented. Accordingly, as shown in FIG. 2 by shading lines indicating a transparent coating, the solder mask material is applied over the entire conductive strip-containing side of the circuit board PC except for two regions R1 and R2 shown by dotted areas. Within the region R1 are the apertures 22, 23 and 24, and the various conductive strips 50 to which the leads extending from the capacitors 10A–10B and the amplifying transistors 4 and 8 are connected. Similarly, within the region R2 are located the resistor 19, the aperture 21, and the capacitors 20A–20B and at least part of the end portions of the associated conductive strip 50 to which the leads from the capacitors 20A–20B and resistor 19 extend.

The present invention has thus provided an extremely effective means for reducing causes of nonlinear distortion due to non-linear discrete and stray capacitances as described. It should be noted that numerous modifications may be made in the most preferred examples of the invention described without deviating from the broader aspects of the invention.

I claim:

1. In an audio amplifier apparatus including an audio amplifier circuit formed by impedance and amplifying elements supported on an insulating circuit board including spaced conductive strips on at least one side of said board defining current paths to and from said discrete elements, said discrete elements having terminal leads connected between otherwise disconnected spaced conductive strips, one of said amplifying elements having at least one pair of terminals at the ends of the leads extending therefrom where the capacitance effect therebetween is enhanced by the Miller effect, said circuit board having applied thereto on the side thereof containing said conductive strips an insulating coating which covers and insulates said conductive strips except at the points where said lead connections to the conductive strips are made, the improvement in means for reducing distortion introduced by non-linearities in the stray capacitance between said lead ends where said Miller effect is operative, said means being the placement of said amplifying elements having said terminals where the capacitance effect is enhanced by the Miller effect and the portions of the conductive strips to which they are connected within the confines of one or more regions of the circuit board which are free of said coating for a sufficient distance back from the ends of the strips that it does not contribute to said Miller effect enhanced capacitance non-linearity.

2. In an audio amplifier apparatus including an audio amplifier circuit formed by discrete impedance and amplifying elements supported on an insulating circuit board including spaced conductive strips on at least one side of said board defining current paths to and from said discrete elements, said discrete elements having terminal leads connected between otherwise disconnected spaced conductive strips, at least one of said amplifying elements having one pair of terminals at the ends of the leads extending therefrom where the capacitance effect therebetween is enhanced by the Miller effect, the improvement in means for reducing distortion introduced by non-linearities in the stray capacitance between said lead ends where said Miller effect is operative, said means being the provision in said circuit board between said terminals connected to otherwise disconnected spaced conductive strips a dielectric region having a dielectric property different from that of said circuit board, which region results in a reduced amount of Miller-effect enhanced non-linear stray capacitance between said terminals.

3. The audio amplifier apparatus of claim 1 wherein said region in said circuit board between said spaced conductive strips comprise an aperture providing an air dielectric between said conductive strips.

4. The audio amplifier apparatus of claim 2 or 3 wherein said amplifying element has a pair of load terminals and a control terminal constituted by the ends of the terminal leads thereof, said terminals where the Miller effect enhanced capacitance occurs being one of the load terminals and said control terminal thereof, the conductive strips to which the latter terminals are connected confronting each other at points along a triangle having two relatively long sides and a relatively short side, said terminals across which said Miller effect-enhanced capacitance takes place being connected respectively to a pair of said spaced conductive strips which confront one another along a relatively long side of said triangle, to minimize the value of the stray capacitance between these terminals.

5. In an audio amplifier apparatus including an audio amplifier circuit formed by discrete impedance and amplifying elements supported on an insulating circuit board including spaced conductive strips on at least one side of said board defining current paths to and from said discrete elements, said discrete elements having terminal leads connected between otherwise disconnected spaced conductive strips, at least one of said amplifying elements having one pair of terminals at the ends of the leads extending therefrom where the capacitance effect therebetween is enhanced by the Miller effect, the improvement in means for reducing distortion introduced by non-linearities in the stray capacitance between said lead ends, being the spacing of the conductive strips to which the terminals of the leads of said amplifying element across which the Miller effect-enhanced capacitance is present so that they are arranged to confront each other at points spaced varying distances apart, said pair of terminals at the ends of the leads extending from the amplifying element where the capacitance effect therebetween is enhanced by the Miller effect being connected to a pair of spaced conductive strips which are the most remote from each other, to minimize the stray capacitance involved therebetween.

6. The audio amplifier apparatus of claim 5 wherein at least one of the amplifying element terminal leads extending to a conductive strip where said Miller effect-enhanced stray capacitance is formed in the circuit board extends generally parallel to the surface of the circuit board and in a direction away from the terminal lead connected to the conductive strip forming the other terminal of said stray capacitance.

7. In an audio amplifier apparatus including an audio amplifier circuit formed by discrete impedance and amplifying elements supported on an insulting circuit board including spaced conductive strips on at least one side of said board defining current paths to and from said discrete elements, said discrete elements having terminal leads connected between otherwise disconnected spaced conductive strips, one of said amplifying elements having at least one pair of terminals at the ends of the leads extending therefrom where the capacitance effect therebetween is enhanced by the Miller effect, the improvement in means for reducing distortion introduced by non-linearities in the stray capacitance between said lead ends where said Miller effect is operative, said means being the orientation of at least one of the leads of said amplifying element, the end of which constitutes one of said pair of terminals where the capacitance effect therebetween is enhanced by the Miller effect, so that said lead extends generally parallel to the surface of the circuit board and connects with a conductive strip on the circuit board at a point spaced a relatively long distance from the point at which the end of the lead constituting the other of said pair of terminals is connected to another conductive strip of the circuit board, the conductive strips to which the terminal-forming ends of said leads are connected being spaced apart a distance corresponding to the spacing of the points of connection of the leads thereto, to minimize the stray capacitance formed therebetween in the circuit board.

8. The audio amplifier apparatus of claim 7 wherein there is provided in said circuit board between said otherwise disconnected strips to which said terminal-forming ends of said leads are connected a region having a dielectric property different from that of said circuit board which region results in a reduced amount of Miller effect-enhanced, nonlinear stray capacitance between said otherwise disconnected conductive strips.

9. The audio amplifier apparatus of claim 8 wherein said region in said circuit board between said spaced conductive strips comprises an aperture providing an air dielectric between said conductive strips.

* * * * *